United States Patent [19]

Neal

[11] 4,140,965
[45] Feb. 20, 1979

[54] ISOLATION VOLTAGE TEST APPARATUS
[75] Inventor: Charles M. Neal, Richardson, Tex.
[73] Assignee: Optron, Inc., Carrollton, Tex.
[21] Appl. No.: 819,222
[22] Filed: Jul. 27, 1977

Related U.S. Application Data

[63] Continuation of Ser. No. 661,340, Feb. 25, 1976, abandoned.

[51] Int. Cl.² .................... G01R 31/12; G01R 1/36
[52] U.S. Cl. ................................. 324/54; 324/110; 324/158 R
[58] Field of Search ............... 324/127, 110, 158 T, 324/158 R, 54, 158 D; 361/18, 35

[56] References Cited
U.S. PATENT DOCUMENTS

| 656,680 | 8/1900 | Thomson | 361/35 |
| 1,614,147 | 1/1927 | Muller | 361/18 |
| 3,054,954 | 9/1962 | Boscia et al. | 324/158 T |

Primary Examiner—Rudolph V. Rolinec
Assistant Examiner—Ernest F. Karlsen
Attorney, Agent, or Firm—Jack A. Kanz

[57] ABSTRACT

Disclosed is an apparatus for providing non-destructive isolation voltage testing of circuit elements which includes a controllable full wave rectifier in series with the primary winding of a high voltage transformer, the secondary winding of which is connected to the circuit element under test. A current detector is responsive to a predetermined threshold current in the tested circuit element for providing a signal to control the rectifier to open-circuit the transformer primary winding prior to destructive breakdown of the tested circuit element. Opto-electronic elements are utilized in the rectifier to provide for the virtually instantaneous open-circuiting of the high voltage transformer primary winding.

13 Claims, 16 Drawing Figures

ISOLATION VOLTAGE TEST APPARATUS

This is a continuation of application Ser. No. 661,340, filed Feb. 25, 1976, now abandoned.

This invention relates to circuit element test apparatus and, more particularly, to apparatus for non-destructively testing isolation voltage levels of circuit elements.

Certain types of circuit elements have their inputs and outputs electrically isolated from each other. For example, opto-electronic devices may comprise in a single package an input light emitting diode and an output phototransistor. The diode and transistor have a visual path therebetween inside the package but are electrically isolated from each other. Although the input and output of such a device are electrically isolated, if a high enough voltage is applied across the input and output terminals, the isolation can break down and the device may be destroyed. One rating classification of such devices is the voltage level which may be sustained across the input and output while still maintaining electrical isolation therebetween.

Different applications of such devices require different isolation levels. A device which cannot withstand a first applied voltage level may be perfectly suitable for use in an environment where the maximum applied voltage level across its input and output is at some lower level. It would therefore be desirable to test such a device to determine if it can withstand a maximum applied voltage and, if the device fails such a test, to subsequently test the device at a lower applied voltage level. In order to accomplish this, the testing must be done so that failure of a device during the test is not destructive of the device itself.

It has additionally been found that many of the devices being tested for isolation voltage levels exhibit polarity sensitivity. That is, a particular device may break down at a different voltage level depending upon the polarity of the voltage applied across the input and output of the device, the difference possibly being as much as 20%. It is not possible to predict which polarity would cause a device to break down at the lowest level. Therefore, if DC isolation voltage testing is performed on a device, it is desirable that both polarities be tested. From the foregoing it becomes apparent that the test voltage should be applied across the input and output terminals of the tested circuit element starting from zero volts and sweeping in both polarities.

It is therefore an object of the present invention to provide apparatus for testing the input/output isolation voltage levels of circuit elements which have their inputs and outputs electrically isolated from each other.

It is a further object of this invention to provide such test apparatus with provisions for avoiding the destructive breakdown effects during such testing.

It is another object of this invention to provide such apparatus which tests both polarities of isolation voltage level to indicate the least of the two isolation voltages which may be sustained by the circuit element under test.

SUMMARY OF THE INVENTION

The foregoing and additional objects are attained by providing apparatus constructed in accordance with principles illustrative of this invention for non-destructively testing the input/output isolation voltage levels of circuit elements. Such apparatus includes a controllable full wave rectifier in series with the primary winding of a high voltage transformer, the secondary winding of which is connected to the circuit element under test. A current detector in series with the circuit element under test is responsive to a predetermined threshold current in the tested circuit element for providing a signal to control the rectifier to open-circuit the transformer primary prior to destructive breakdown of the tested circuit element. A display provides a visual indication to the test apparatus operator as to whether the tested circuit element passes or fails the test. A timer in the test apparatus is provided and the apparatus is responsive to the absence of the aforementioned signal during a predetermined test time interval for terminating the test and controlling the display to provide a "pass" indication. Opto-electronic elements are utilized in the rectifier as switches to provide virtually instantaneous open-circuiting of the high voltage transformer primary winding in the event of a failure.

DESCRIPTION OF THE DRAWING

The foregoing will be more readily understood upon reading the following description in conjunction with the drawing in which.

DESCRIPTION OF THE PREFERRED EMBODIMENT

Figure 1:
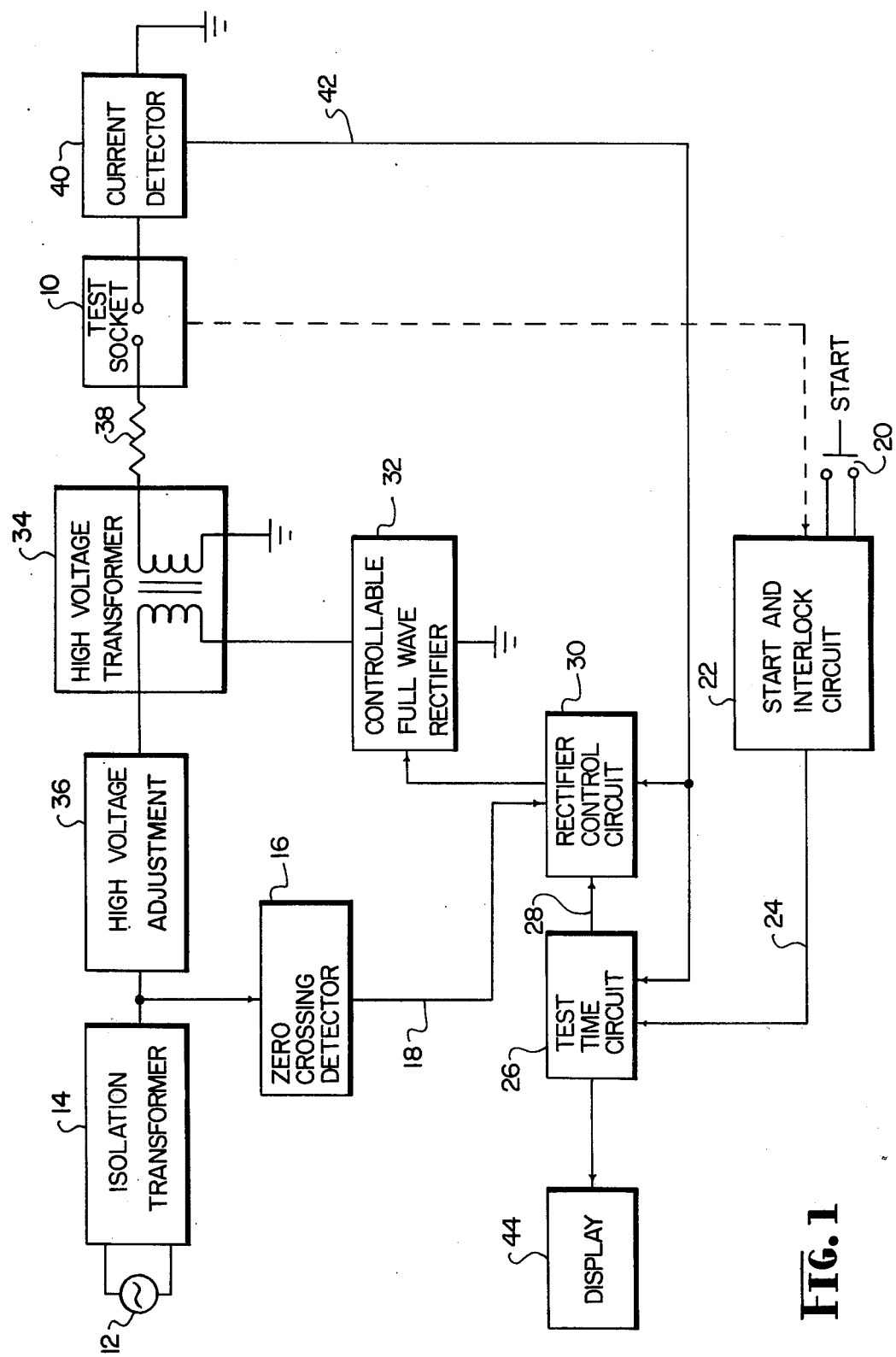
FIG. 1 depicts a schematic block diagram of illustrative isolation voltage test apparatus operating in accordance with the principles of this invention.

Referring now to the drawing, and in particular to FIG. 1, depicted therein is a schematic block diagram of apparatus for performing nondestructive input/output isolation voltage testing on a circuit element inserted in test socket 10. Depending upon the type of circuit element to be tested, different sockets may be utilized, the particular socket not forming a part of this invention except that the socket should be arranged so that all the input and output terminals of the circuit element are respectively shorted together. The socket functions to electrically couple the circuit element to the test apparatus. The apparatus is coupled to standard 60 hertz commercially available power source 12 through isolation transformer 14. Zero crossing detector 16 provides a pulse on lead 18 every time the line voltage crosses zero volts. When a circuit element is correctly placed in test socket 10 and start button 20 is operated, start and interlock circuit 22 places a signal on line 24 to cause test time circuit 26 to initiate timing the test interval.

During the test time interval, test time circuit 26 places an enabling signal on lead 28 to cause rectifier control circuit 30 to control controllable full wave rectifier 32 to complete a path for the primary winding of high voltage transformer 34. Control circuit 30 utilizes the zero crossing signals on lead 18 to operate rectifier 30 at zero crossings of the voltage waveform so as to minimize transient effects. High voltage adjustment 36 is utilized to control the voltage across the circuit element in socket 10. This voltage may be on the order of 3.5 kilovolts. Resistor 38 is a current limiting resistor for the secondary winding of high voltage transformer 34.

Current detector 40 monitors the current through the circuit element under test, which circuit element is in socket 10. When a threshold current is exceeded, this signifies that the element under test is breaking down and a failure signal is applied to lead 42 by current detector 40. The failure signal on lead 42 is utilized to terminate the test by causing rectifier control circuit 30 to control rectifier 32 to open the path in the primary winding of high voltage transformer 34. It should be noted at this point that rectifier 32 must virtually instantaneously open the path in the primary winding of high voltage transformer 34 to avoid the total destruction of the circuit element in socket 10. The failure signal on lead 42 may occur at any point in the AC sweep, at any voltage at either polarity. Therefore, the switches in rectifier 32 must be capable of turning off the rectifier at any point in the sine wave of the AC power cycle.

Display 44 provides a visual indication of whether the circuit element under test can sustain the voltage applied across its input and output terminals. The circuitry depicted in FIG. 1 is designed such that when there is a failure signal on lead 42, the "fail" indication is provided by display 44. Alternatively, in the event that there is no failure signal on lead 42 and test time circuit 26 completes timing the test time interval, the "pass" indication is provided by display 44 and the test is terminated, test time circuit 26 causing rectifier control circuit 30 to control rectifier 32 to open the path in the primary winding of transformer 34.

Figure 2A:
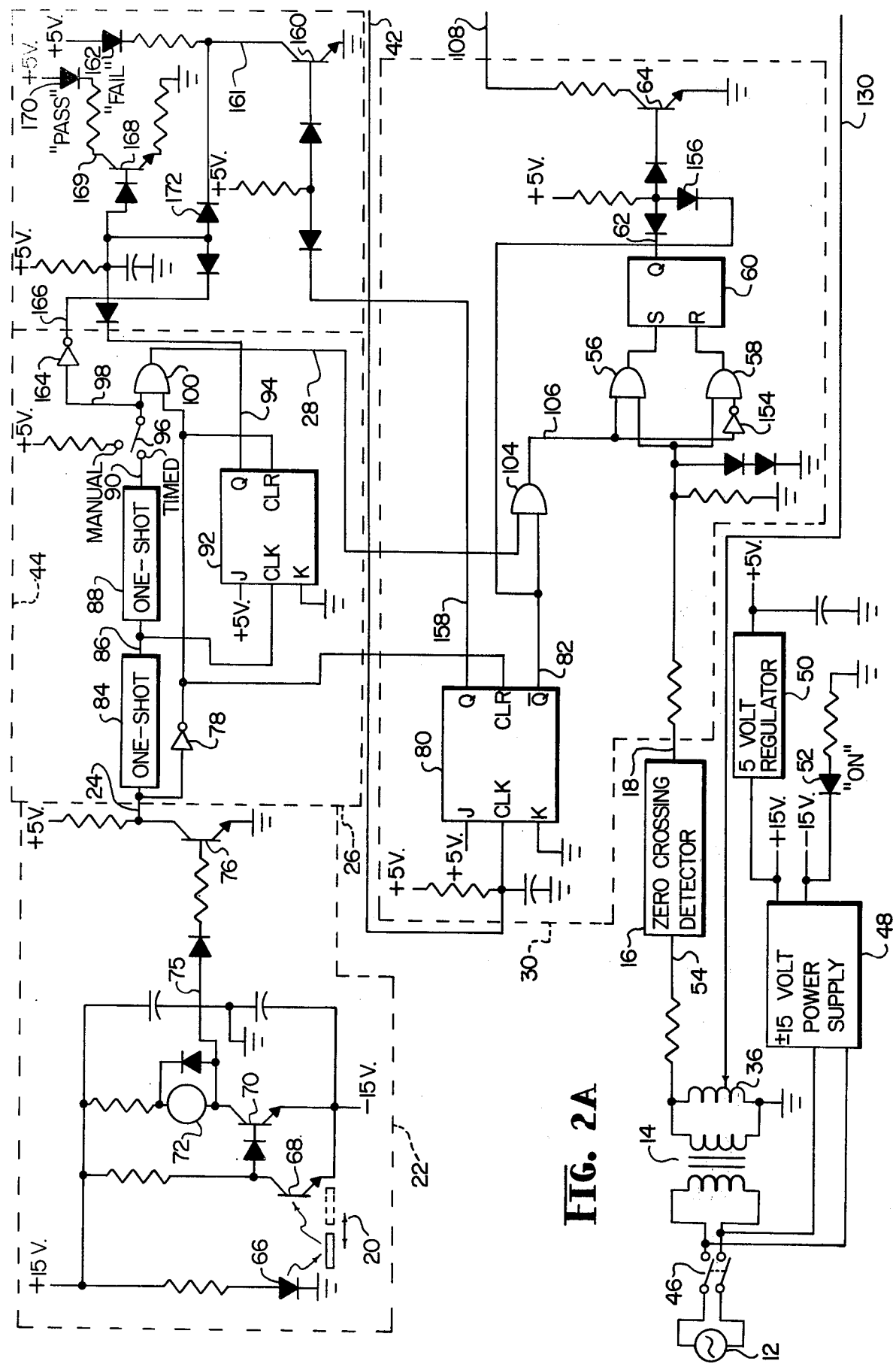
FIGS. 2A and 2B, with FIG. 2A placed to the left of FIG. 2B, depict a detailed schematic diagram of exemplary circuitry implementing the block schematic diagram of FIG. 1.
Figure 2B:
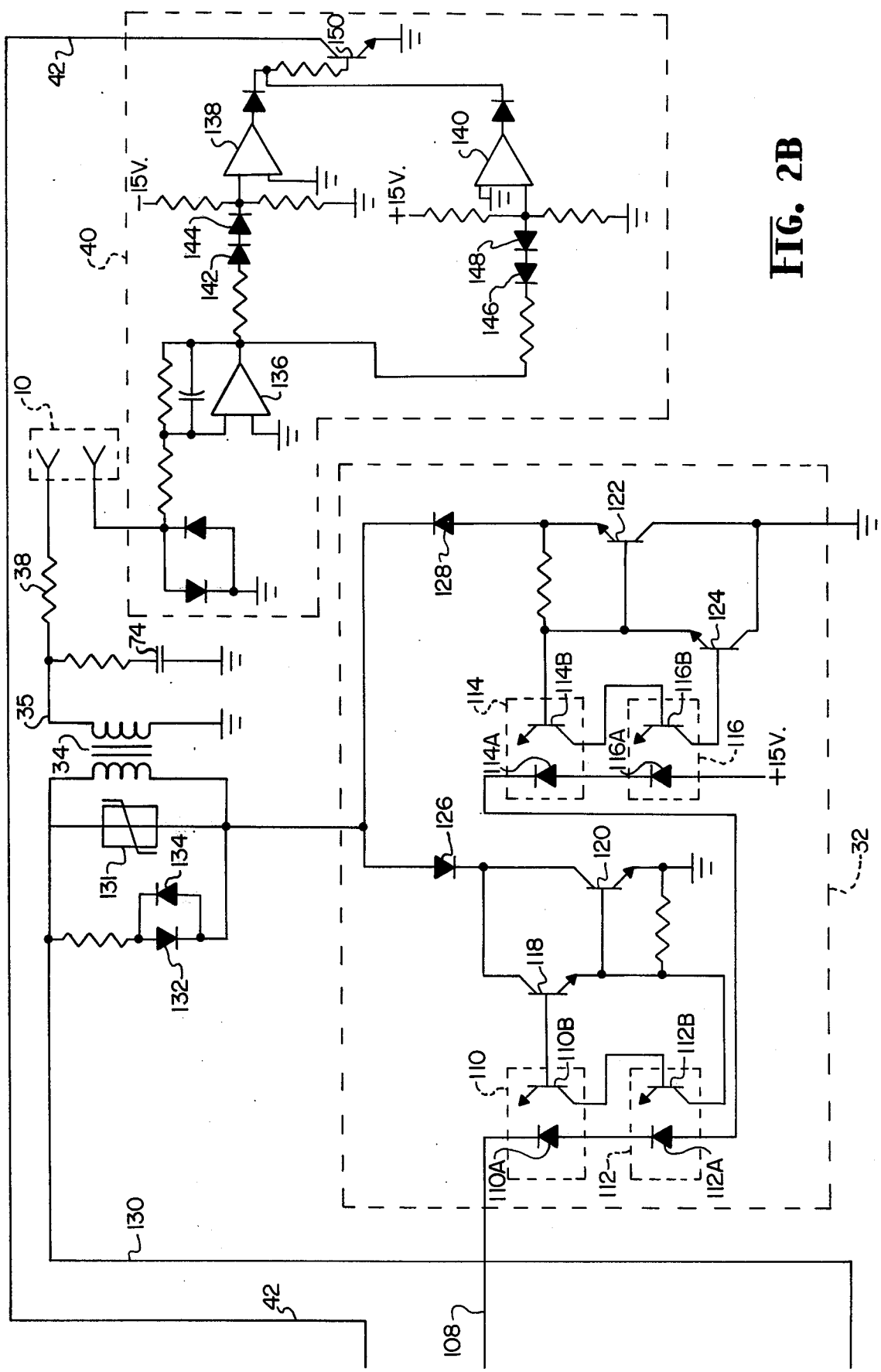

Referring now to FIGS. 2A and 2B, exemplary circuitry for implementing the block schematic diagram of FIG. 1 will now be described, like reference numerals denoting like elements. The circuitry illustrated in FIGS. 2A and 2B is comprised of standard logic elements, integrated circuits and other readily available components. The following discussion is therefore directed to the overall operation of the circuitry, it being understood that one skilled in the art is familiar with the operation of the individual components and circuit elements therein. Cross reference will be made to the timing charts of FIGS. 3A-3M to aid in understanding the circuit operation. FIGS. 3A-3M depict voltage waveforms at various points in the circuitry of FIGS. 2A and 2B, the use of primed reference numerals being intended to refer to the signal equivalents of corresponding unprimed elements as shown in FIGS. 2A and 2B, the double primed numerals in FIGS. 3J and 3K referring to those signals when the circuitry senses a test failure.

The apparatus depicted in FIGS. 2A and 2B is connected to source 12 through power switch 46. Power supply 48 and regulator 50 provide the necessary voltage levels for operating the circuitry of FIGS. 2A and 2B. Light emitting diode 52 is provided as part of display 44, although not shown explicitly as a part thereof, to provide a visual indication of the power status of the test set apparatus. The voltage from source 12 (FIG. 3A) passes through isolation transformer 14, having a unitary turns ratio, and is then coupled to zero crossing detector 16, illustratively a type CA3059 integrated circuit manufactured by RCA. Zero crossing detector 16 is adapted to provide a positive going pulse on line 18 (FIG. 3B) at every zero crossing of the signal applied to its input 54, regardless of whether the zero crossing is going in the positive or negative direction. This pulse is coupled through gates 56 or 58 to the set or reset inputs, respectively, of flip-flop 60 within control circuit 30. When flip-flop 60 is in its set state, its Q output on lead 62 (FIGS. 3F, 3K) is high, causing transistor 64 to conduct. When transistor 64 conducts, this causes full wave rectifier 32 to close a path in the primary winding of high voltage transformer 34, in a manner to be described hereinafter.

Initially, flip-slop 60 is in its reset state. After power switch 46 is closed and a circuit element is placed in socket 10, start switch 20 may be operated. For safety purposes, start switch 20 may be part of an interlock feature and is illustratively shown as being a reflective element which when in a first position as shown in FIG. 2A in solid lines allows light from light emitting diode 66 to be reflected to the base of phototransistor 68. When switch 20 is in the position illustrated by the dotted lines, no light from light emitting diode 66 is reflected to the base of phototransistor 68. Illustratively, diode 66 and transistor 68 may be in a single package, such as an OPB710 package, manufactured by Optron, Inc., Carrollton, Texas. When switch 20 is in the position shown by the dotted lines, transistor 68 is in a nonconductive state. This causes transistor 70 to turn on, thereby energizing relay 72 whose normally open contact 74 (FIG. 2B) across the secondary winding of high voltage transformer 34 closes to prevent power from reaching socket 10. When a circuit element is placed in socket 10 and switch 20 is moved to the position shown by the solid lines in FIG. 2A, phototransistor 68 becomes conductive and turns off transistor 70, de-energizing relay 72 and opening contacts 74, allowing the high voltage from transformer 34 to be applied to the circuit element in socket 10.

Figure 3A:
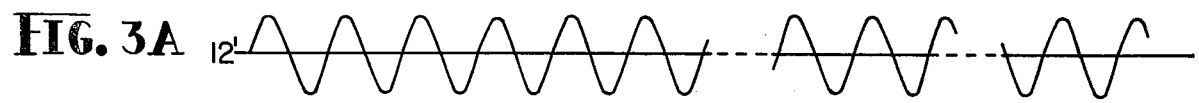
FIGS. 3A–3M are timing charts useful in understanding the operation of the circuitry shown in FIGS. 2A and 2B.
Figure 3B:
Figure 3C:
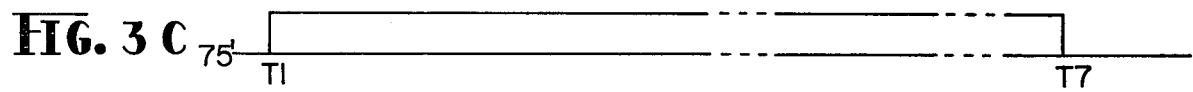
Figure 3D:
Figure 3E:
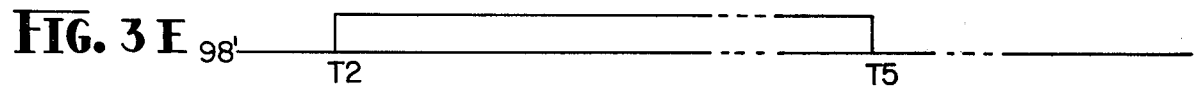
Figure 3F:
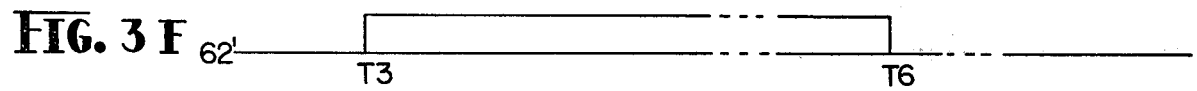

When transistor 70 is turned off, a high signal is applied to lead 75 (time T1, FIG. 3C), causing transistor 76 to turn on, and placing a low signal on lead 24. This low signal on lead 24 is inverted by inverter 78 and removes the clear signal from JK flip-flops 80 and 92. The low signal on lead 24 also triggers one-shot multivibrator 84 which provides a short interval pulse, illustratively 12 milliseconds, on lead 86 (FIG. 3D). This pulse on lead 86 triggers one-shot multivibrator 88 which is chosen to provide a high signal on lead 90 (time T2, FIG. 3E) for the test time interval, illustratively chosen to be approximately 1.8 seconds. The pulse on lead 86 also causes JK flip-flop 92 to be set and provide a high signal on its output lead 94 at the conclusion of the 12 millisecond pulse from one-shot 84.

The test set apparatus in accordance with this invention may be operated in either a manual mode or a timed mode, according to the setting of switch 96. When switch 96 is placed in the MANUAL position, a positive signal is applied to lead 98 at all times. When switch 96 is in the TIMED position, a positive signal is applied to lead 98 only for the test time interval. It will be recalled that inverter 78 provides at its output a positive signal so long as switch 20 is in the position shown by the solid lines. This positive signal combined with the positive signal on lead 98 for the duration of the test time causes gate 100 to provide a positive signal on lead 28 to gate 104. The other input to gate 104 is the Q̄ output flip-flop 80, which is positive. Therefore, for the duration of the test, or until there is a failure indication as will be described hereinafter, there is a positive signal on lead 106. This positive signal on lead 106 combines with the next positive zero crossing pulse on lead 18 to cause a positive pulse to be applied to the output of gate 56 to the set input of flip-flop 60, putting a high signal on lead 62 and turning on the rectifier 32 at a zero crossing of the input power source wave form (time T3, FIG. 3F).

With transistor 64 conducting a low signal is present on lead 108 to rectifier 32. The control elements in rectifier 32 illustratively comprise four opto-electronic packages 110, 112, 114 and 116. These packages may be illustratively type OPB2152 packages manufactured by Optron, Inc. (It should be noted at this point that the test set apparatus described herein is particularly adapted for testing these opto-electronic packages.) Each opto-electronic package comprises a light emitting diode 110A, 112A, 114A and 116A optically coupled to a respective phototransistor, 110B, 112B, 114B and 116B. When current flows through each of the light emitting diodes, this causes the respective phototransistor to turn on. The collector to base diode portions of phototransistors 110B, 112B, 114B and 116B are coupled to control the full wave rectifier comprising transistors 118, 120, 122 and 124 and diodes 126 and 128. (Opto-isolators utilizing photodiodes rather than phototransistors could also be utilized to implement this function.) This full wave rectifier is in series with the primary winding of high voltage transformer 34, which is connected via lead 130 to high voltage adjustment 36 which is illustratively a type 10B powerstat manufactured by Superior Electric. Also coupled across the primary winding of transformer 34 is a Varactor 131, illustratively a type V150LA10A manufactured by General Electric, for suppressing high voltage spikes. Further, a pair of light emitting diodes 132 and 134 may be placed across the primary winding of transformer 34 to indicate that the high voltage is on.

Figure 3G:
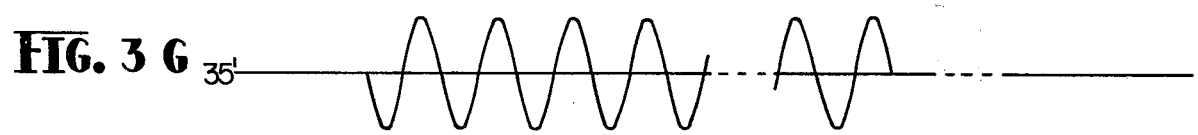
Figure 3H:
Figure 3I:
Figure 3J:
Figure 3K:
Figure 3L:
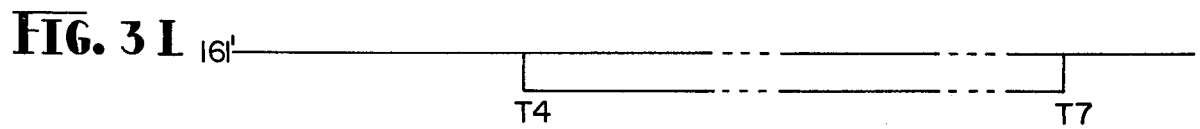
Figure 3M:
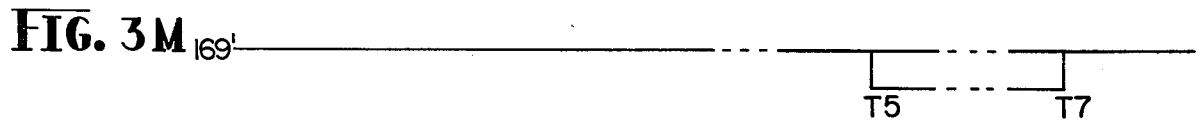

A high voltage from the secondary winding of transformer 34 on lead 35 (FIG. 3G) is then applied to the test subject in socket 10. The circuit element in socket 10 is serially connected to current detector 40. The current through the tested element is monitored by operational amplifier 136 which is illustratively adjusted to provide a 1 volt output for every 10 microamps of current through the tested circuit element. The output of operational amplifier 136 is coupled to the inputs of operational amplifiers 138 and 140. The threshold current illustratively chosen to indicate a device failure is 30 microamps. This translates to a 3 volt output from amplifier 136. This output may be either positive or negative, depending upon whether the device fails during a positive or negative half cycle of the input power. Diodes 142, 144, 146 and 148 are therefore chosen to each have a 1.5 volt forward diode drop so that a 3 volt output from operational amplifier 136 will cause an output from operational amplifier 138 if positive and from operational amplifier 140 if negative. If either of amplifiers 138 and 140 provides an output signal, this indicates that 30 microamps of current is passing through the circuit element under test in socket 10 and this causes transistor 150 to conduct, placing a ground level failure signal on lead 42 (FIG. 3H). A ground on lead 42 will immediately set flip-flop 80, putting a low signal on lead 82 (time T4, FIG. 3I). The low signal on lead 82 will provide a low signal at the base of transistor 64, through diode 156, immediately turning off transistor 64 and removing the ground from lead 108. Removing the ground from lead 108 causes opto-electronic elements 110, 112, 114 and 116 to turn off rectifier 32, open-circuiting the primary of high voltage transformer 34 and removing current from the tested circuit element in socket 10 before that element is destroyed by the test (FIG. 3J). Note from an inspection of FIG. 3J that when the transformer primary is open-circuited at other than a zero crossing point, there is a transient overdrive present during shut-off. The setting of flip-flop 80 in response to the failure signal on lead 42 causes a high signal to be placed on lead 158, causing transistor 160 to turn on, placing a low signal on lead 161 (time T4, FIG. 3L), and providing a current path for light emitting diode 162 inside the display 44. Light emitting diode 162 provides a visual indication of a failure of the circuit element in socket 10.

If the circuit element in socket 10 does not conduct current during the test, there will not be a low signal on lead 42. During the test time, it will be recalled that lead 98 had a high signal thereon. Inverter 164 inverts this high signal and places a low signal on lead 166 for the duration of the test time. This low signal on lead 166 maintains transistor 168 in the non-conductive state. At the conclusion of the test time, the signal on lead 98 goes low (time T5, FIG. 3E). At the next zero crossing pulse, flip-flop 60 is reset, causing lead 62 to go low (time T6, FIG. 3F) and turning off rectifier 32. This insures removing the high voltage at a zero crossing, thereby eliminating transient effects (FIG. 3G).

Also, at the conclusion of the test time when the signal on lead 98 goes low, the signal on lead 166 correspondingly goes high. This causes transistor 168 to turn on, placing a low signal on lead 169 (time T5, FIG. 3M), and allowing current to flow through light emitting diode 170, which when lit provides a visual indication that the circuit element in test socket 10 has successfully passed the isolation voltage test. Diode 172 is for the purpose of preventing transistor 168 from conducting if transistor 160 conducts. To summarize the operation of display 44, the "fail" diode 162 will be lit instantaneously upon detection of the threshold current through the circuit element under test whereas the "pass" diode 170 will be lit only on the successful termination of the test time interval without there being a detection of the threshold current. When switch 20 is subsequently moved to the dotted line position (time T7, FIG. 3C), the display is extinguished (time T7, FIGS. 3L, 3M).

Accordingly, there has been described apparatus which provides non-destructive isolation voltage testing of circuit elements. This apparatus is responsive to a threshold current through the element under test for terminating the test prior to the destruction of the circuit element. Such circuit element may then be tested at a lower voltage level, if desired. The control swtiches in the full wave rectifier portion of the apparatus comprise opto-electronic elements which may be turned off at any point in the power cycle, thereby allowing the test to be terminated within a matter of microseconds after a failure is detected. It is understood that the above-described arrangement is merely illustratively of the application of the principles of this invention. Numerous other arrangements may be devised by those skilled in the art without departing from the spirit and scope of this invention as defined by the appended claims. For example, it is apparent that the aforedescribed apparatus may be automatically controlled to lower the test voltage in the event of a failure, thereby automatically testing a device at ever decreasing voltage levels until it passes.

What is claimed:

1. Apparatus for non-destructively testing the isolation voltage level between terminals of a device comprising:
   socket means for electrically coupling said terminals to said apparatus;

high voltage transformer means having a primary winding and a secondary winding;

first coupling means for coupling said secondary winding to said socket means;

second coupling means for coupling said primary winding to a source of AC power;

starting means for providing a start signal to initiate a test of said device;

timer means coupled to said starting means and responsive to said start signal for providing a timing signal of predetermined duration;

current detector means in circuit relationship with said socket means and responsive to current through said device exceeding a predetermined threshold value for providing a failure signal;

control means coupled to said timer means and said current detector means, said control means being responsive to said timing signal in the absence of said failure signal for providing an enabling signal and responsive to said failure signal for terminating said enabling signal; and means serially connected to said primary winding and responsive to said enabling signal for completing a current path for said primary winding.

2. The apparatus of claim 1 further comprising;

first indicating means responsive to said failure signal for providing a first indication; and second indicating means responsive to the termination of said timing signal in the absence of said failure signal for providing a second indication.

3. The apparatus of claim 1 wherein said second coupling means includes means for adjusting the voltage applied to said primary winding.

4. The apparatus of claim 1 wherein said path completing means includes full wave rectifier means.

5. The apparatus of claim 4 wherein said path completing means further includes switch means responsive to said enabling signal for turning on said full wave rectifier means.

6. The apparatus of claim 5 wherein said switch means includes a phototransistor for completing a conductive path in said full wave rectifier means when light impinges on the base of said phototransistor and a light emitting diode optically coupled to said base and responsive to said enabling signal for providing light to turn on said phototransistor.

7. The apparatus of claim 1 further including manual switch means for bypassing said timer means to provide said timing signal so long as said manual switch means is operative.

8. The apparatus of claim 1 further comprising zero crossing detector means coupled to said second coupling means for providing a zero crossing signal whenever the AC power waveform crosses zero volts;

said control means being further coupled to said zero crossing detector means and including means responsive to said zero crossing signal for initiating and terminating said enabling signal in the absence of said failure signal coincident with a zero crossing of the AC power waveform.

9. Apparatus for non-destructive isolation voltage testing of circuit elements, comprising:

a voltage source providing AC test signals;

switching means, when actuated, for applying said AC test signals across the terminals of a circuit element being tested, and, when deactuated, for interrupting the application of said AC test signals across the terminals of said circuit element being tested;

current detector means for providing a failure signal in response to current through said circuit element exceeding a predetermined threshold value;

starting means for providing a start signal to initiate a test of said circuit element being tested;

timer means coupled to said starting means for providing a timing signal of predetermined duration in response to said start signal; and control means coupled to said timer means and said current detector means for respectively actuating and deactuating said switching means, said control means being responsive to said timing signal in the absence of said failure signal to provide an enabling signal for actuating said switching means, said control means furthermore being responsive to said failure signal for terminating said enabling signal, thereby to deactuate said switching means.

10. The apparatus as defined by claim 9 further including socket means for receiving said circuit element being tested, and wherein said switching means comprises a high voltage transformer having a primary winding coupled with said voltage source and a secondary winding coupled with said socket means.

11. The apparatus as defined by claim 10 wherein said control means is effective to open circuit said primary winding in response to said failure signal.

12. The apparatus as defined by claim 11 further including means for adjusting the magnitude of the voltage of said test signals.

13. The apparatus as defined by claim 9 wherein said control means is responsive to the zero crossings of the AC test signals of the voltage source, the control means to actuate the switching means substantially at a zero crossing in response to the timing signal and the absence of the failure signal whereby transient effects of operating the switching means are minimized.

* * * * *